(12) United States Patent
Priwisch et al.

(10) Patent No.: US 12,196,669 B2
(45) Date of Patent: Jan. 14, 2025

(54) INSPECTION APPARATUS AND METHOD OF INSPECTING WAFER

(71) Applicant: SAMSUNG ELECTRONICS CO., LTD., Suwon-si (KR)

(72) Inventors: Martin Priwisch, Hwaseong-si (KR); Jongmin Yoon, Incheon (KR); Suhwan Park, Incheon (KR); Inkeun Baek, Sejong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 333 days.

(21) Appl. No.: 17/882,673

(22) Filed: Aug. 8, 2022

(65) Prior Publication Data

US 2023/0204503 A1 Jun. 29, 2023

(30) Foreign Application Priority Data

Dec. 27, 2021 (KR) .................. 10-2021-0188868

(51) Int. Cl.
*G01N 21/3581* (2014.01)
*G01N 21/95* (2006.01)
(Continued)

(52) U.S. Cl.
CPC ..... *G01N 21/3581* (2013.01); *G01N 21/9501* (2013.01); *G01Q 60/22* (2013.01); *G01R 31/311* (2013.01)

(58) Field of Classification Search
CPC .......... G01N 21/3581; G01N 21/9501; G01N 21/9505; G01N 21/3586; G01N 21/3563;
(Continued)

(56) References Cited

U.S. PATENT DOCUMENTS 5,894,125 A 4/1999 Brener et al.
6,873,165 B2 3/2005 Lee et al.
(Continued)

FOREIGN PATENT DOCUMENTS

CN 110618104 12/2019
CN 107860742 4/2020
(Continued)

OTHER PUBLICATIONS

Iwami, Kentaro, Takahito Ono, and Masayoshi Esashi. "A new approach to terahertz local spectroscopy using microfabricated scanning near-field probe." Japanese Journal of Applied Physics 47.10R (2008): 8095. (Year: 2008).*

(Continued)

*Primary Examiner* — Jia X Pan
*Assistant Examiner* — Richard O Toohey
(74) *Attorney, Agent, or Firm* — F. CHAU & ASSOCIATES, LLC

(57) ABSTRACT

An inspection apparatus includes: a first probe including a receiver antenna configured to detect the terahertz wave emitted by an inspection signal source and that has passed through the wafer, wherein the first probe includes: a first probe tip in which the receiver antenna is embedded, the receiver antenna including a first photoconductive switch; a first printed circuit board on which the first probe tip is mounted; a first optical bracket coupled to the first printed circuit board; a first optical connector configured to transmit a first laser beam into the first probe, and coupled to the first optical bracket, wherein the first laser beam is configured to excite the first photoconductive switch.

20 Claims, 20 Drawing Sheets

(51) Int. Cl.
*G01Q 60/22* (2010.01)
*G01R 31/311* (2006.01)

(58) Field of Classification Search
CPC .......... G01N 2021/3568; G01Q 60/22; G01R 31/311; G01J 3/42; H01Q 9/16; H01L 22/10
See application file for complete search history.

(56) References Cited

U.S. PATENT DOCUMENTS

| | | | |
|---|---|---|---|
| 7,511,512 B2 * | 3/2009 | Sekiguchi | G01Q 60/22 324/638 |
| 8,187,424 B2 | 5/2012 | Haran et al. | |
| 9,273,994 B2 | 3/2016 | Zheng et al. | |
| 9,464,933 B1 | 10/2016 | Sherry | |
| 9,618,824 B2 | 4/2017 | Mohammed et al. | |
| 9,823,187 B2 | 11/2017 | Brown | |
| 2007/0235650 A1 * | 10/2007 | Federici | G01N 21/636 250/341.8 |
| 2022/0412898 A1 * | 12/2022 | Priwisch | G01N 22/02 |

FOREIGN PATENT DOCUMENTS

| | | | | |
|---|---|---|---|---|
| DE | 102019005412 | * | 1/2021 | ......... G01N 21/3581 |
| JP | 2006-024803 | | 1/2006 | |
| WO | 2019-201564 | | 10/2019 | |
| WO | 2021-171367 | | 9/2021 | |

OTHER PUBLICATIONS

Nagel, M., et al. "A novel scattering-type SNOM-tip featuring a micro-integrated bias-free optically driven terahertz pulse emitter." 2020 45th International Conference on Infrared, Millimeter, and Terahertz Waves (IRMMW-THz). IEEE, 2020. (Year: 2020).*

* cited by examiner

INSPECTION APPARATUS AND METHOD OF INSPECTING WAFER

CROSS-REFERENCE TO RELATED APPLICATION

This application claims priority under 35 U.S.C. § 119 to Korean Patent Application No. 10-2021-0188868, filed on Dec. 27, 2021 in the Korean Intellectual Property Office, the disclosure of which is incorporated by reference herein in its entirety.

TECHNICAL FIELD

The present inventive concept relates to an inspection apparatus, and more particularly, to an inspection apparatus for inspecting a wafer and/or a semiconductor package by using an electromagnetic wave of a terahertz band, and a method of inspecting a wafer by using the inspection apparatus.

DISCUSSION OF THE RELATED ART

Recently, as the technique for generating and detecting a terahertz wave have been under development, research into terahertz-related application is in progress in various fields, such as biology, chemistry, mechanical engineering, and radio communication engineering, Unlike X-rays, which cause damage to and/or changes to physical properties of a sample or a test object due to a high energy of the X-rays, non-electrolytic electromagnetism fine terahertz waves having a low level of energy are less likely to change or damage the physical properties of the test object. Accordingly, terahertz wave inspection is variously applied to non-contact and non-destructive test fields.

A representative application of terahertz waves in the semiconductor industry is the quality evaluation of integrated circuits and semiconductor packages. Terahertz waves might, not penetrate a metal pattern formed inside a semiconductor chip due to characteristics of radio waves, but because the terahertz waves penetrate a polymer material inside a package well, the terahertz waves may be applied to a package inspection, In addition, because the inspection method using terahertz waves may proceed in a free space, there might not be a need to provide a medium, and because the inspection method does not need to directly contact the inspection object, a non-contact inline process may be applied.

SUMMARY

The present inventive concept relates to an inspection apparatus having increased reliability and inspection speed, According to an example embodiment of the present inventive concept, an inspection apparatus includes; a stage configured to support a wafer; an inspection signal source facing the stage, and configured to emit a terahertz wave to the wafer; a first probe including a receiver antenna configured to detect the terahertz wave emitted by the inspection signal source and that has passed through the wafer; and a second probe including an emitter antenna and a detector antenna, wherein the emitter antenna is configured to emit a terahertz wave to the wafer, and the detector antenna is configured to detect the terahertz wave emitted by the emitter antenna and reflected by the wafer, wherein the first probe includes: a first probe up in which the receiver antenna is embedded, the receiver antenna including a first photoconductive switch; a first printed circuit board on which the first probe tip is mounted; a first optical bracket coupled to the first printed circuit board; a first optical connector configured to transmit a first laser beam into the first probe, and coupled to the first optical bracket, wherein the first laser beam is configured to excite the first photoconductive switch; a first optical cable connected to the first optical connector, arranged between the first optical bracket and the first printed circuit board, and configured to guide the first laser beam; a first lens connected to the first optical cable, fixed to the first optical bracket, and configured to focus the first laser beam; and a first mirror fixed to the first optical bracket and configured to reflect the first laser beam received from the first lens so that the first laser beam is directed toward the first photoconductive switch.

According to an example embodiment of the present inventive concept, an inspection apparatus includes: a stage including an upper surface parallel to a first direction and a second direction intersecting the first direction, and supporting a wafer; an inspection signal source configured to emit a terahertz wave on the wafer; a first probe including a receiver antenna configured to detect the terahertz wave emitted by the inspection signal source and that has passed through the wafer; and a second probe including an emitter antenna and a detector antenna, wherein the emitter antenna is configured to emit a terahertz wave to the wafer, and the detector antenna is configured to detect the terahertz wave emitted by the emitter antenna and reflected by the wafer, wherein the first probe includes: a first printed circuit board; a first probe tip, in which the receiver antenna is embedded, mounted on the first printed circuit board, wherein the receiver antenna includes a first photoconductive switch; a first optical bracket coupled to the first printed circuit board; a first optical connector configured to transmit a first laser beam into the first probe, and coupled to the first optical bracket, wherein the first laser beam is configured to excite the first photoconductive switch; and a second optical connector configured to transmit a second laser beam into the first probe, and coupled to the first optical bracket, wherein the second laser beam is configured to excite the wafer; wherein the second probe includes: a second printed circuit board; a second probe tip, in which the emitter antenna and the detector antenna are embedded, mounted on the second printed circuit board, wherein the emitter antenna includes a second photoconductive switch, and wherein the detector antenna includes a third photoconductive switch; a second optical bracket coupled to the second printed circuit board; a third optical connector configured to transmit a third laser beam into the second probe, and coupled to the second optical bracket, wherein the third laser beam is configured to excite the second photoconductive switch; a fourth optical connector configured to transmit a fourth laser beam into the second probe, and coupled to the second optical bracket, wherein the fourth laser beam is configured to excite the third photoconductive switch; and a fifth optical connector configured to transmit a fifth laser beam into the second probe, and coupled to the second optical bracket, wherein the fifth laser beam is configured to excite the wafer.

According to an example embodiment of the present inventive concept, a method of inspecting a wafer includes: aligning a first probe with respect to the wafer; and inspecting the wafer, wherein the first probe includes: a first probe tip in which a receiver antenna is embedded, the receiver antenna including a first photoconductive switch; a first printed circuit board on which the first probe tip is mounted; a first optical connector configured to transmit a first laser beam into the first probe, and coupled to a first optical bracket, wherein the first laser beam is configured to excite the first photoconductive switch; a first optical cable connected to the first optical connector, arranged between the first optical bracket and the first printed circuit board, and configured to guide the first laser beam; a first lens connected to the first optical cable, fixed to the first optical bracket, and configured to focus the first laser beam; and a first mirror fixed to the first optical bracket and configured to reflect the first laser beam received front the first lens so that the first laser beam is directed toward the first photoconductive switch, wherein the aligning of the first probe with respect to the wafer includes: exciting the first photoconductive switch by irradiating the first photoconductive switch with the first laser beam; and moving the first probe to a position where an electrical signal, which is generated by the receiver antenna in response to a terahertz wave signal that has passed through the wafer, is maximized.

BRIEF DESCRIPTION OF THE DRAWINGS

The above and other aspects of the present inventive concept will become more apparent by describing in detail embodiments thereof, with reference to the accompanying drawings, in which.

Figure 10:
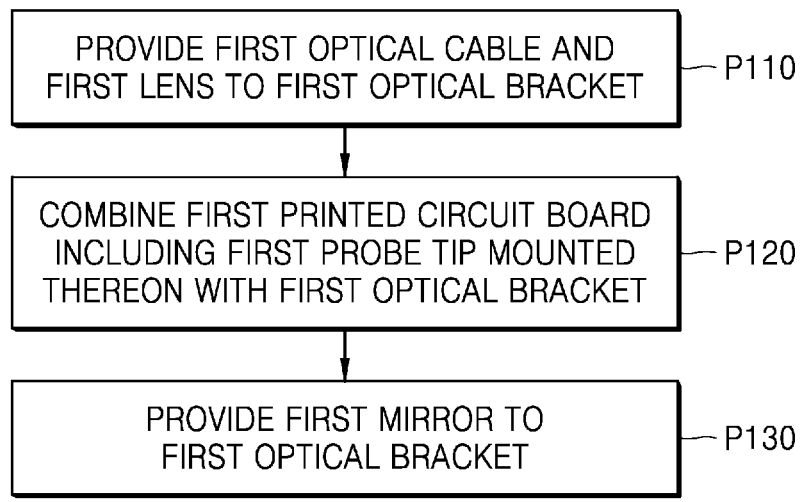
Figure 11A:
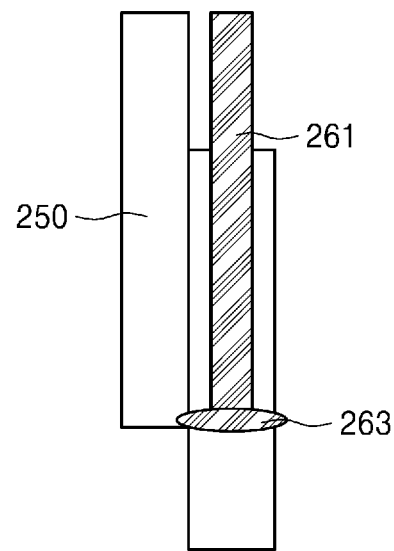
Figure 11B:
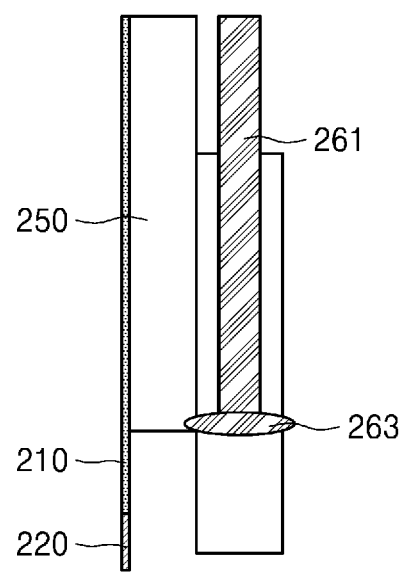
Figure 11C:
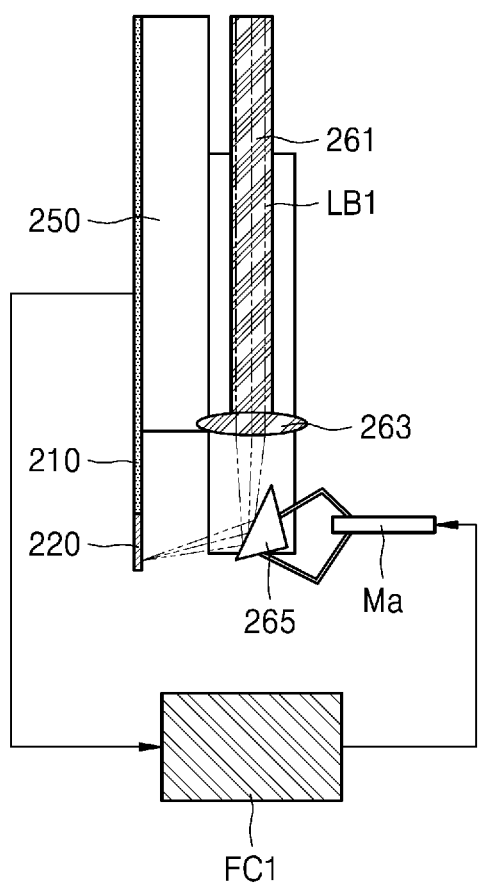
Figure 12:
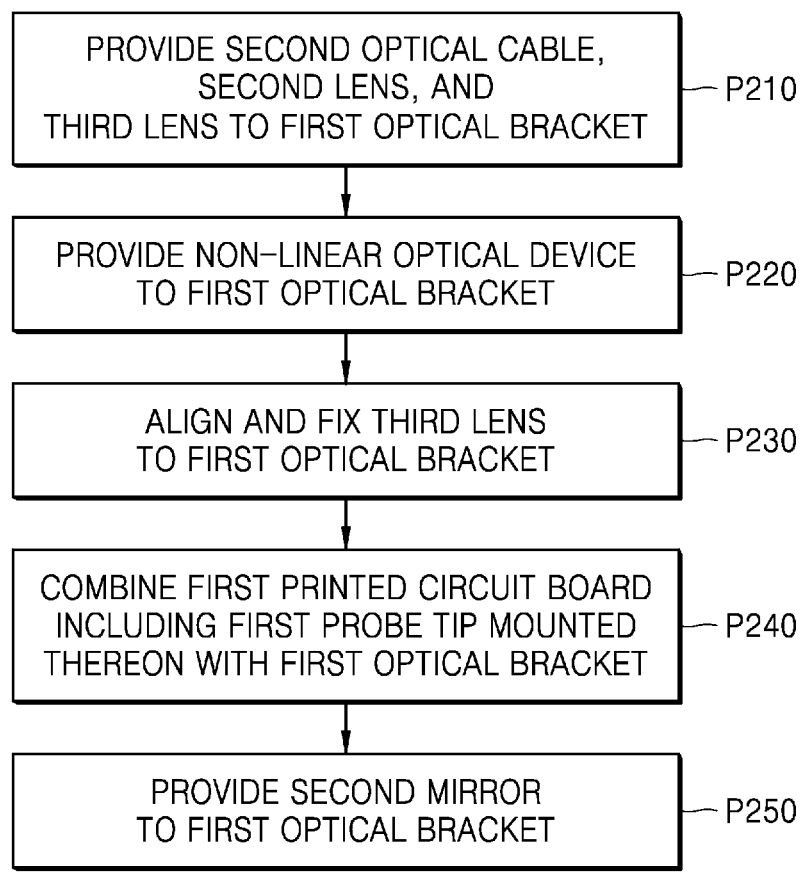
Figure 14:
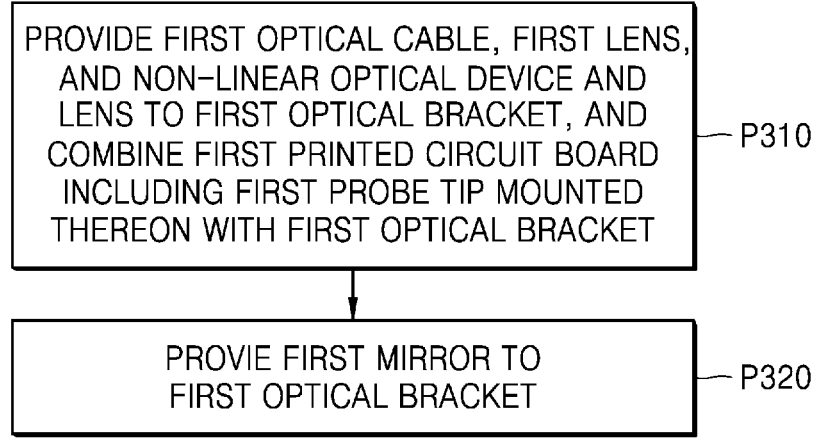
Figure 15:
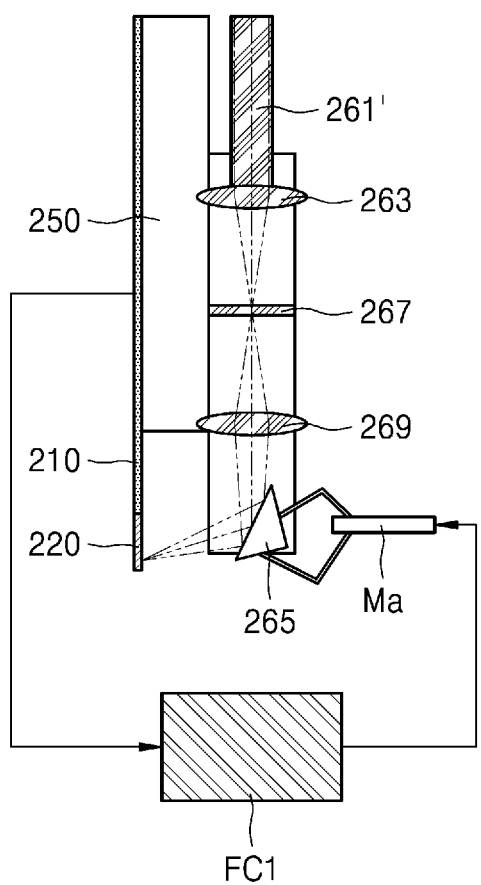

FIGS, 8 and 9 are schematic diagrams describing inspection of an inspection apparat Us, according to example embodiments of the present inventive concept;

FIG. 10 is a flowchart of a method of manufacturing a first probe, according to an example embodiment of the present inventive concept:

FIGS. 11A, 11B and 11C are side cross-sectional views for describing the method of manufacturing a first probe illustrated in FIG. 10;

FIG. 12 is a flowchart of a method of manufacturing a first probe of an inspection apparatus, according to an example embodiment of the present inventive concept;

FIGS. 13A, 13B, 13C, 13D and 13E are side cross-sectional views for describing the method of manufacturing a first probe of an inspection apparatus illustrated in FIG. 12;

FIG. 14 is a flowchart of a method of manufacturing a first probe of an inspection apparatus, according to an example embodiment of the present inventive concept; and FIG. 15 is a side cross-sectional view for describing the method of manufacturing a first probe of an inspection apparatus illustrated in FIG. 14.

DETAILED DESCRIPTION OF THE EMBODIMENTS

Hereinafter, example embodiments of the present inventive concept are described in detail with reference to the accompanying drawings. Identical reference numerals are used for the same components in the drawings, and a duplicate description thereof may be omitted, It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or !section without departing from the spirit and scope of the present inventive concept.

Figure 1:
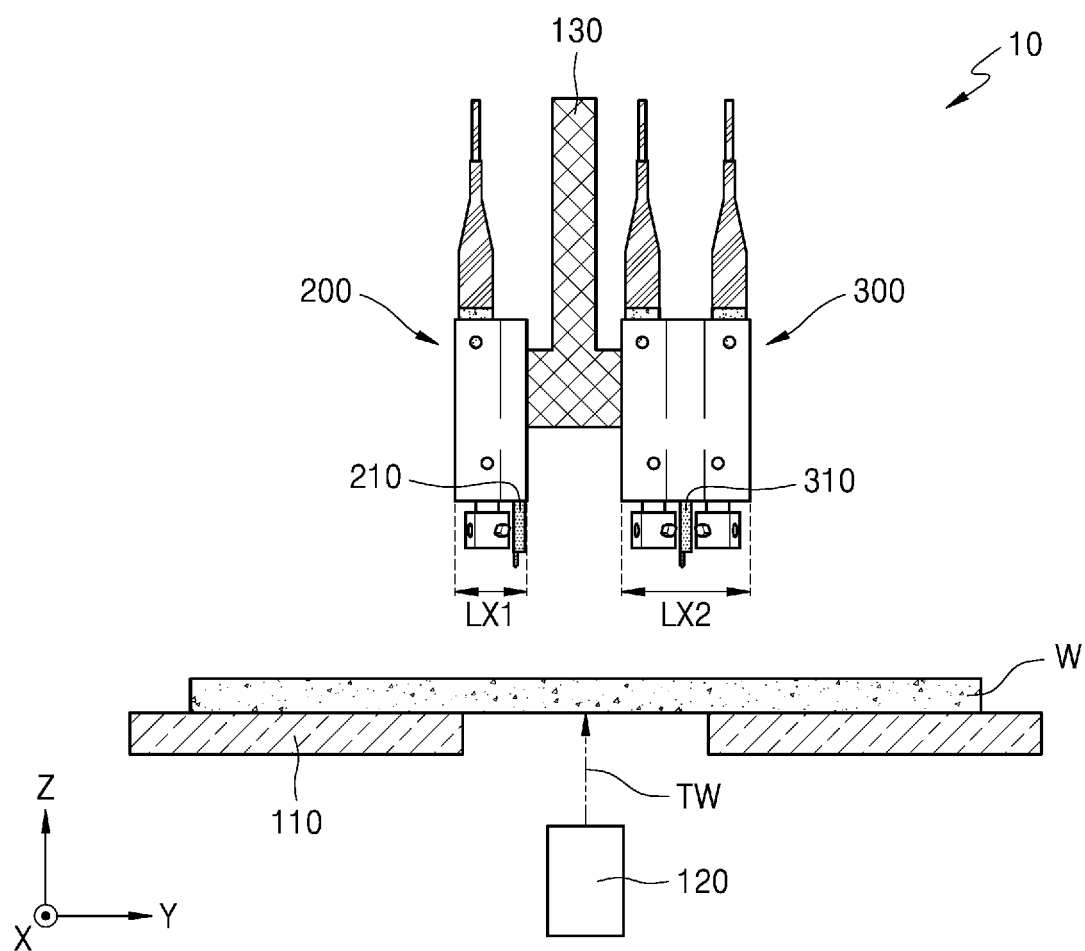
FIG. 1 is a schematic diagram of an inspection apparatus according to an example embodiment of the present inventive concept.

FIG. 1 is a schematic diagram of an inspection apparatus 10 according to an example embodiment of the present inventive concept.

Referring to FIG. 1, the inspection apparatus 10 may include a stage 110, an inspection signal source 120, an alignment device 130, a first probe 200, and a second probe 300.

The inspection apparatus 10 may non-destructively inspect an inspection object, for example, a wafer W, etc. An inspection object of the inspection apparatus 10 might not he limited to the wafer W, but may include individualized and packaged semiconductor elements, etc.

Hereinafter, a device under test to be inspected by the inspection apparatus 10 may be mainly described with reference to the wafer W, as an example, but those of ordinary skill in the art may understand the inspection apparatus 10 to be capable of inspecting a semiconductor chip and a semiconductor package, based on the descriptions below.

hi this case, the wafer W may include, for example, silicon (Si). The wafer W may include a semiconductor element, such as germanium (Ge), or a compound semiconductor, such as silicon carbide (SiC), gallium arsenide (GaAs), indium arsenide (InAs), and/or indium phosphor (InP). According to an example embodiment of the present inventive concept, the wafer W may have a silicon on insulator (SOI) structure, The wafer W may include a buried oxide layer. According to an example embodiment of the present inventive concept, the wafer W may include conductive regions, for example, a well doped with impurities. In an example embodiment of the present inventive concept, the wafers W may have various device isolation structures, such as a shallow trench isolation (STI), which separates the doped wells from each other.

The inspection apparatus 10 may inspect the wafer W, on which a series of processes have been performed. In this case, a series of processes may include various processes for forming a semiconductor element, The series of processes may include, for example, an ion doping process, an oxidation process for forming an oxide layer, a spin coating process, a lithography process including exposure and development, a thin layer deposition process including a chemical vapor deposition (CM) process, an atomic layer deposition (AID) process, and a physical vapor deposition (PVD) process, a dry etching process, a wet etching process, a metal wiring process, etc.

According to an example embodiment of the present inventive concept, the inspection apparatus 10 may include a line inspection apparatus included in various wafer processing devices. Accordingly, the inspection apparatus 10 may inspect in real time the wafer W processed by a wafer processing device. The wafer processing device may include, for example, an exposure device using a stepper method or a scanner method, a dry/wet etching facility, a plasma etching facility, a cleaning facility, a plasma asher facility, a polishing facility such as a chemical mechanical polishing (CMP) facility, an ion implantation facility, a PVD facility, a CVD facility, an ALD facility, an annealing facility, etc. However, the present inventive concept is not limited thereto, and the inspection apparatus 10 may be discretely provided outside of the wafer processing device.

The inspection apparatus 10 may include, for example, a terahertz time domain spectrometer. The inspection apparatus 10 may inspect the wafer W by providing to the wafer W an ultrashort pulse signal in a certain frequency band in a terahertz range (for example, about 0.1 THz to about 10 THz), and then detecting a frequency-strength distribution of the ultrashort pulse signal having been reflected by the wafer W or having passed through the wafer W. From the inspection result by using the inspection apparatus 10, information about, for example, doping concentration of the wafer W and movement of a carrier may be obtained.

The inspection of the wafer W may be performed by comparing a terahertz time domain spectrum with respect to a standard water W. The inspection of the wafer W may include a scanning inspection on the entire surface of the wafer W, or a spot inspection on some regions of the wafer W. Different portions of the wafer W may be inspected by driving the inspection stage 110. The inspection stage 110 may move the wafer W in an X direction, a direction, and a Z direction, or rotate the wafer W with the Z direction as an axis.

In this case, the X direction and the Y direction may be two directions that are substantially perpendicular to each other and may be parallel to an upper surface of the inspection stage 110. The Z direction may include a direction substantially vertical to the upper surface of the inspection stage 110. The X direction, the. Y direction, and the Z direction may be substantially perpendicular to each other. Unless otherwise specified, the directions are the same as those in other diagrams below.

The inspection apparatus 10 may operate in a reflection mode or a transmission mode. The first probe 200 may be used in a transmission mode inspection, and the second probe 300 may be used in a reflection mode inspection. In the transmission mode, the inspection signal source 120 may emit a terahertz wave TW on one surface of the wafer W, and the terahertz wave TW having passed through the wafer W may be detected by the first probe 200. In the reflection mode, the second probe 300 may provide an inspection signal to the wafer W, and the second probe 300 may detect again the inspection signal reflected by the wafer W.

The inspection signal source 120 may generate the terahertz wave TW, and emit the terahertz wave TW to the wafer W. The inspection apparatus 10 may include a beam transfer optics for transferring the terahertz wave TW generated by the inspection signal source 120 to the wafer W. The beam transfer optics may include various optical components, such as a polarizing or non-polarizing beam splitter, a focusing lens, a collimating lens, a spherical mirror, a non-spherical mirror, etc.

The alignment device 130 may move the first and second probes 200 and 300 to appropriate locations for inspecting the wafer W. The alignment device 130 may move, for example, the first probe 200 so that the first probe 200 detects the terahertz wave TW having passed through the wafer W. The alignment device 130 may move the first probe 200 so that a first probe tip 220 is positioned at the spatial maximum point of the terahertz wave TW on an X-Y plane. The alignment device 130 may move the first and second probes 200 and 300 vertically (for example, in the Z direction so that the first and second probes 200 and 300 have an appropriate distance for inspection (for example, tens of micrometers) vertically (for example, in the Z direction) from the upper surface of the wafer W.

Figure 2:
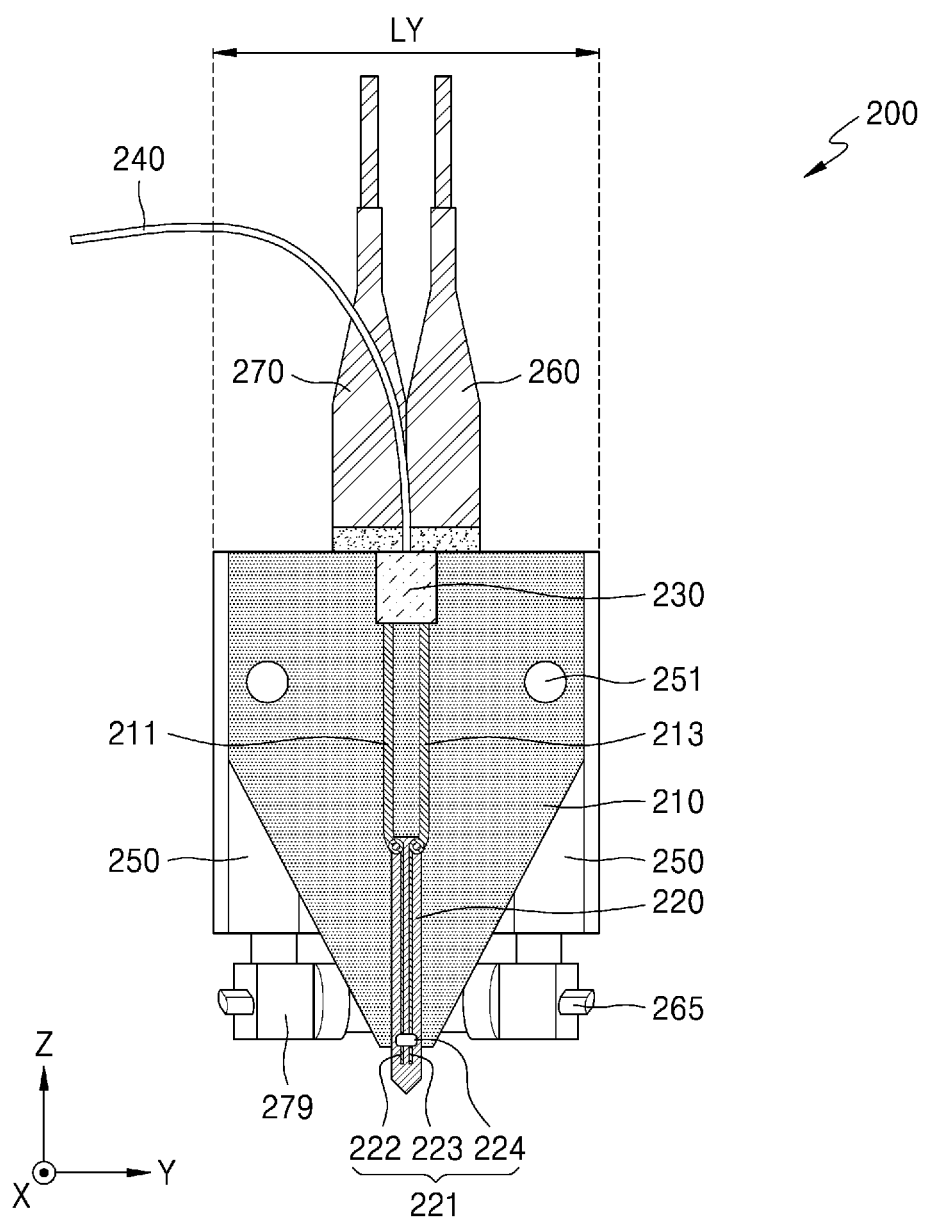
FIG. 2 is a plan view of a first probe included in an inspection apparatus according to an example embodiment of the present inventive concept.

FIG. 2 is a plan view of the first probe 200 included in the inspection apparatus 10.

Figure 3:
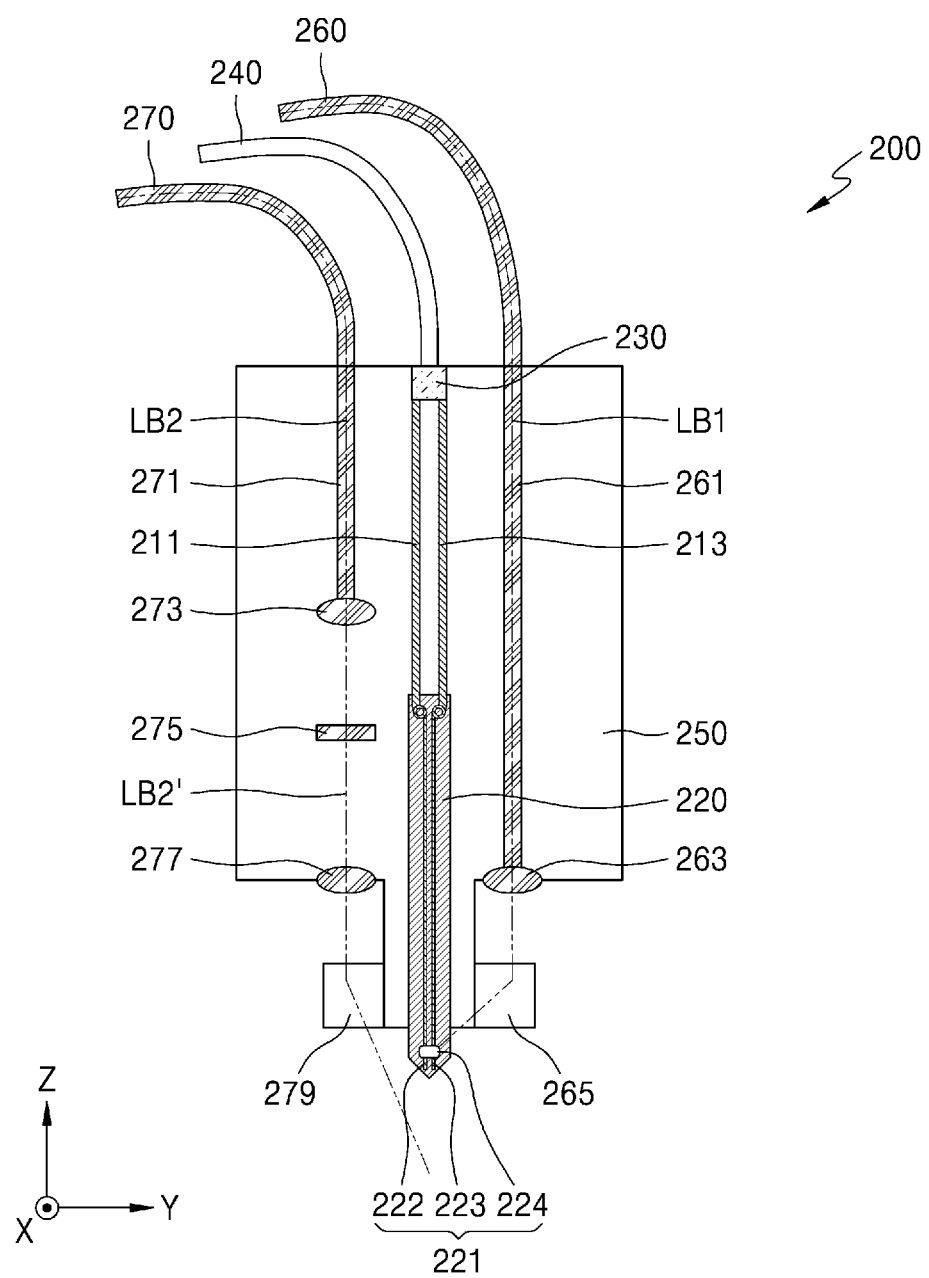
FIG. 3 schematically illustrates electrical and optical configurations of a first probe included in the inspection apparatus according to an example embodiment of the present inventive concept.

FIG. 3 schematically illustrates electrical and optical configurations of the first probe 200 included in the inspection apparatus 10.

Referring to FIGS. 1 through 3, the first probe 200 may include a first terahertz wave optics, a first excitation optics, and a second excitation optics. The first terahertz wave optics may include a first printed circuit board 210, the first probe tip 220, a radio frequency (RF) connector 230, and an RF signal line 240. The first excitation optics may include a first optical connector 260, a first optical cable 261, a first lens 263, and a first mirror 265. The second excitation optics may include a second optical connector 270, a second optical cable 271, a second lens 273, a first non-linear optical device 275, a third lens 277, and a second mirror 279.

The first printed circuit board 210 may fix and mechanically support the first probe tip 220. The first probe tip 220 may be mounted on the first printed circuit board 210. The first probe tip 220 may be mounted on the first printed circuit board 210. The first printed circuit board 210 may include conductive patterns 211 and 213 for receiving and reading signals detected by a receiver antenna 221.

The receiver antenna 221 for detecting the terahertz wave TW haying passed through the wafer W may be embedded in the first probe tip 220. The receiver antenna 221 may include, for example, a dipole antenna. The receiver antenna 221 may include first and second electrodes 222 and 223, and a first photoconductive switch 224 connected to the first and second electrodes 222 and 223. The first photoconductive switch 224 may generate a light-excited carrier in response to a first laser beam LB1.

The first probe tip 220 may he a vertical type. For example, when the first probe 200 is mounted on the alignment device 130, an extension direction of the first probe tip 220 may be substantially parallel to the Z direction. Accordingly, the first probe 200 may detect the terahertz wave TW that originated from a narrow region of the wafer W, and the resolution of the inspection apparatus 10 may be increased.

When the first laser beam LB1 is emitted onto the first photoconductive switch 224 and at the same time, the terahertz wave TW that has passed through the wafer W reaches the receiver antenna 221, light-excited carriers may be accelerated by the terahertz wave TW, and accordingly, the terahertz signal in the transmission mode may be sensed. According to an example embodiment of the present inventive concept, the first laser beam LB1 may be a gating signal, which tams on/off the receiver antenna 221 According to an example embodiment of the present inventive concept, the terahertz wave TW may have a pulse train including a plurality of ultrashort pulses, and the receiver antenna 221 may sense a portion of the plurality of ultrashort pulses, which timely and spatially overlap the first laser beam LB1, (for example, the ultrashort pulses substantially and simultaneously arriving at the first laser beam LB1 and the receiver antenna 221). In other words, while the first laser beam LB1 is emitted, the receiver antenna 221 may sense the terahertz wave TW having passed through the wafer W, and while the first laser beam LB1 is not emitted, the receiver antenna 221 might not sense the terahertz wave TW having passed through the wafer W.

An electrical signal generated by the receiver antenna 221 in response to the terahertz wave TW may be output via the conductive patterns 211 and 213, the RF connector 230, and the RF signal line 240.

The inspection apparatus 10 may include a first optical bracket 250 coupled to the first printed circuit board 210. The first optical bracket 250 may be coupled to the first printed circuit board 210 by using, for example, a combination device 251, such as a bolt and a nut, The first optical bracket 250 may cover and fix optical components, which are coupled to the first probe 200, such as the first optical cable 261, the first lens 263, the first mirror 265, the second optical cable 271, the second lens 273, the first non-linear optical device 275, the third lens 277, and the second mirror 279.

The first optical cable 261, the first lens 263, the first mirror 265, the second optical cable 271, the second lens 273, the first non-linear optical device 275, the third lens 277, and the second mirror 279 may be fixed to the first optical bracket 250 by using, for example, epoxy, etc.

According to an example embodiment of the present inventive concept, the first optical cable 261, the first lens 263, the second optical cable 271, the second lens 273, the first non-linear optical device 275, and the third lens 277 may be arranged between the first printed circuit board 210 and the first optical bracket 250.

According to an example embodiment of the present inventive concept, the first optical bracket. 250 may cover one side of the first printed circuit board 210 and expose (for example, might not cover) the other side thereof Accordingly, the first probe 200 may be provided in a relatively small size, and the inspection apparatus 10 may include a desirable number of first probes 200. However, the present inventive concept is not limited thereto, and the first optical bracket 250 may also cover both surfaces of the first printed circuit board 210 to at least partially surround the first printed circuit board 210.

The first optical connector 260 may be connected to the first optical cable 261, The first optical connector 260 may introduce the first laser beam LB1 into the first probe 200. The first laser beam LB1 introduced by the first optical connector 260 may be guided along the first optical cable 261. The first optical cable 261 may include an optical fiber.

According to an example embodiment of the present inventive concept, a wavelength of the first laser beam LB1 may be in a range of about 300 nm to about 1600 nm. As a non-limiting example, the wavelength of the first laser beam LB1 may be about 1560 nm.

The first optical cable 261 may be connected to the first lens 263. Accordingly, the first laser beam LB1 guided along the first optical cable 261 may be transferred to the first lens 263. The first lens 263 may focus the first laser beam LB1 The first laser beam LB1 focused by the first lens 263 may be reflected by the first mirror 265. The first laser beam LB1 reflected by the first mirror 265 may be focused on the first photoconductive switch 224, According to an example embodiment of the present inventive concept, after being reflected by the first mirror 265, the first laser beam LB1 may be transferred through a free space optics, not an optical fiber circuit or an optical integrated circuit. In other words, an air gap may be arranged between the first mirror 265 and the first photoconductive switch 224 of the receiver antenna 221. Accordingly, an occurrence of multiple reflections of the terahertz signal transferred by the receiver antenna 221 and a sensing of external noise by the receiver antenna 221 may be prevented. Accordingly, the reliability of the inspection apparatus 10 may be increased.

The second optical connector 270 may be coupled to the first optical bracket 250. The second optical connector 270 may be connected to the second optical cable 271, The second optical connector 270 may introduce a second laser beam LB2 into the first probe 200. The second laser beam LB2 introduced by the second optical connector 270 may be guided along the second optical cable 271. The second optical cable 271 may include optical fiber.

According to an example embodiment of the present inventive concept, a wavelength of the second laser beam LB2 may be in a range of about 300 nm to about 1600 nm. As a non-limiting example, the wavelength of the second laser beam LB2 may be about 1560 nm. The second laser beam LB2 may be generated by the same laser device generating the first laser beam LB1 but the present inventive concept is not limited thereto.

The second optical cable 271 may be connected to the second lens 273. Accordingly, the second laser beam LB2 guided along the second optical cable 271 may be transferred to the second lens 273. The second lens 273 may focus the second laser beam LB2 on the first non-linear optical device 275. According to an example embodiment of the present inventive concept, because a focus of the second lens 273 is on the first non-linear optical device 275, a frequency conversion efficiency of the first non-linear optical device 275 may be maximized.

The first non-linear optical device 275 may receive the second laser beam LB2, and output a second laser beam LB2' having a different frequency from that of the second laser beam LB2. As an example, the first non-linear optical device 275 may include a second harmonic generator, and generate the second laser beam LB2' haying a frequency larger than the frequency of the second laser beam LB2. For example, the frequency of the second laser beam LB2' may be about two times greater than the frequency of the second laser beam LB2. An example of the second harmonic generator may include any one of periodically poled lithium niobate (PPLN) crystal and beta barium borate (BBE) or β-$BaB_2O_4$ crystal. Another example of the second harmonic generator may include lithium triborate (LBO) or $LiB_3O_5$, monoclinic bismuth borate (BIBO) or $BiB_3O_6$, potassium titanyl arsenate (KTA) or $KTiOAsO_4$, potassium titanyl phosphate (KTP) or $KTiOPO_4$. As an example, when a wavelength of the second laser beam LB2 is about 1560 nm and the first non-linear optical device 275 includes a second harmonic generator, a wavelength of the second laser beam LB2' may be about 780 nm.

However, the present inventive concept is not limited thereto, and the first non-linear optical device 275 may include an arbitrary device for generating light of a predetermined wavelength for example, a wavelength of about 800 nm or less) for exciting the wafer W in response to the second laser beam LB2.

The first non-linear optical device 275 may generate the second laser beam LB2' by using various (for example, second-order, third-order, and fourth-order or higher-order) non-linear optical phenomena.

In this case, an example of a second-order non-linear optical phenomenon may include an optical parametric process in addition to second harmonic generation (SHG).

An example of the a third-order non-linear optical phenomenon may include third harmonic generation (THG), third-order sum frequency generation (TSFG), four-wave mixing (FWM), stimulated Raman scattering (SRS), optical Kerr effect (OKE), Raman induced Kerr effect (RIKE), stimulated Rayleigh scattering, stimulated Brillouin scattering (SBS), stimulated Kerr scattering, stimulated Rayleigh-Bragg scattering, stimulated Mie scattering, self-phase modulation (SPM), cross phase modulation (XPM), optical-field induced birefringence, and electric-field induced SHG.

An example of fourth-order or higher non-linear optical phenomenon may include hyper-Raman scattering, hyper-Rayleigh scattering, and coherent anti-Stokes hyper-Raman scattering.

Figure 4:
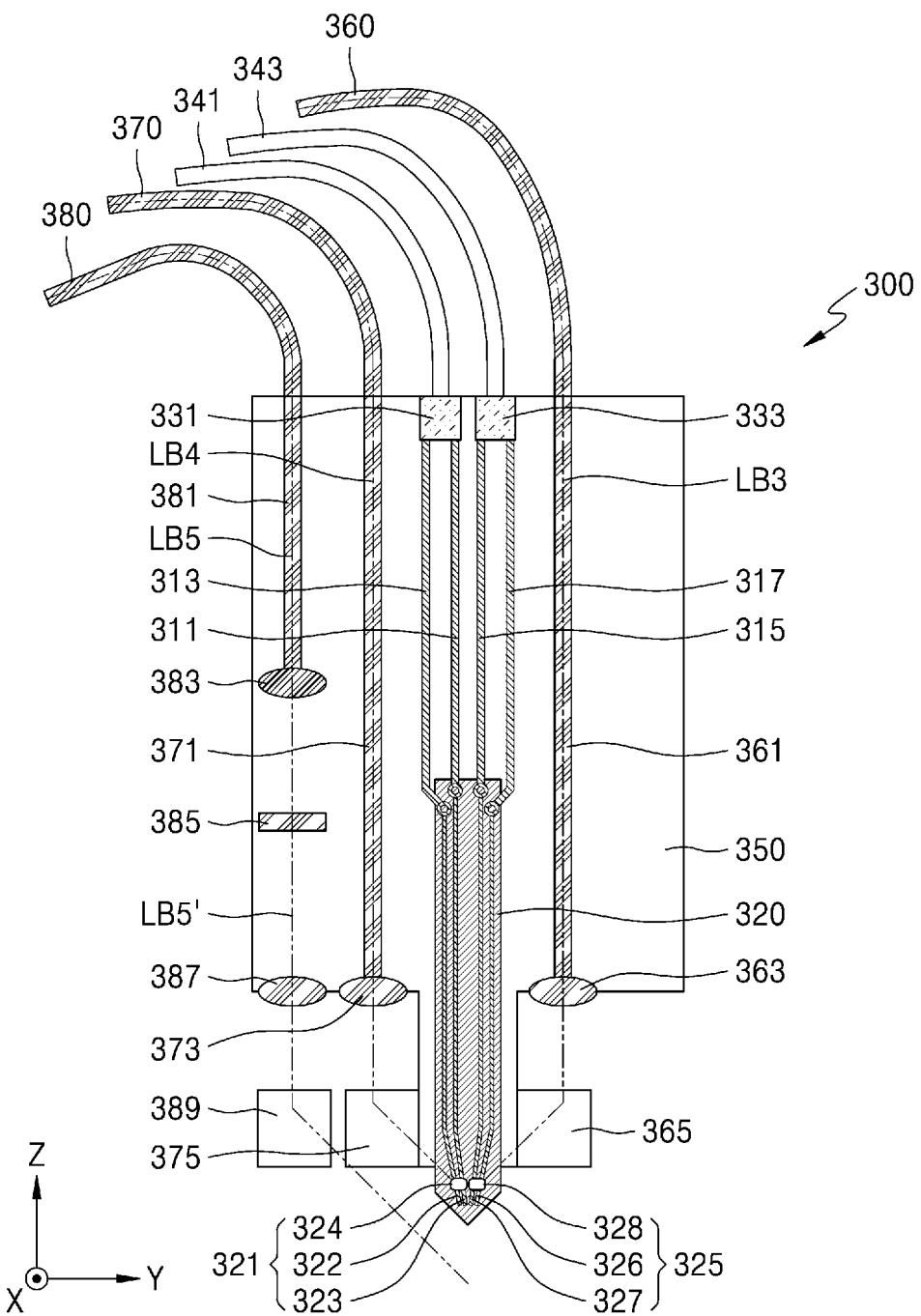
FIG. 4 schematically illustrates electrical and optical configurations of a second probe included in the inspection apparatus according to an example embodiment of the present inventive concept.

The second laser beam LB2' output by the first non-linear optical device 275 may reach the third lens 277. The third lens 277 may focus the second laser beam LB2' on the second minor 279. The second laser beam LB2' focused by the third lens 277 to the second mirror 279 may be reflected by the second mirror 279. The second laser beam LB2' reflected by the second mirror 279 may be focused on the wafer W The second laser beam LB2° may excite a portion of the wafer W, and in this case, sensitivity of inspection of doping concentration carrier movement of the excited portion of the wafer W may be increased, FIG. 4 schematically illustrates electrical and optical configurations of the second probe 300 included in the inspection apparatus 10, Referring to FIGS. 1 and 4, the second probe 300 may include a second terahertz wave optics, a third excitation optics, a fourth excitation optics, and a fifth excitation optics. The second terahertz wave optics may include a second printed circuit board 310, a second probe tip 320, first and second RF connectors 331 and 333, and first and second RF signal lines 341 and 343. The third excitation optics may include a third optical connector 360, a third optical cable 361, a fourth lens 363, and a third mirror 365. The fourth excitation optics may include a fourth optical connector 370, a fourth optical cable 371, a fifth lens 373, and a fourth mirror 375. The fifth excitation optics may include a fifth optical connector 380, a fifth optical cable 381, a sixth lens 383, a second non-linear optical device 385, a seventh lens 387, and a fifth mirror 389.

The second printed circuit board 310 may fix and mechanically support the second probe tip 320. The second probe tip 320 may be mounted on the second printed circuit board 310. The second printed circuit board 310 may provide a signal for driving an emitter antenna 321, and may include conductive patterns 311, 313, 315, and 317 for outputting an electrical signal generated by a detector antenna 325.

The second probe tip 320 may be a vertical type. For example, when the second probe 300 is mounted on the alignment device 130, an extension direction of the second probe tip 320 may be substantially parallel to the Z direction, According to an example embodiment of the present inventive concept, an inspection by using the second probe tip 320 may he limited in a small region of the wafer W, and accordingly, the resolution of the inspection apparatus 10 may be increased.

The emitter antenna 321 for irradiating a terahertz wave signal to the wafer W and the detector antenna 325 for detecting the terahertz wave signal, which has been emitted by the emitter antenna 321 and reflected by the wafer W, may be embedded in the second probe tip 320. Each of the emitter antenna 321 and the detector antenna 325 may include, for example, a dipole antenna.

The emitter antenna 321 may include third and fourth electrodes 322 and 323, and a second photoconductive switch 324 connected to the third and fourth electrodes 322 and 323. The second photoconductive switch 324 may generate a light-excited carrier in response to a fourth laser beam LB4.

When the fourth laser beam LB4 is emitted onto the second photoconductive switch 324 and, at the same time, terahertz power is provided to the emitter antenna 321 by a first RF signal line 341, a light-excited carrier may be accelerated and the terahertz wave may be emitted. The fourth laser beam LB4 may be a gating signal for turning on/off the emitter antenna 321. According to an example embodiment of the present inventive concept, terahertz power in form of pulse train including a plurality of ultra-short pulses may be provided to the emitter antenna 321, and the emitter antenna 321 may generate ultrashort pulses in a terahertz band in response to a portion of the plurality of ultrashort pulses, which timely and spatially overlap the fourth laser beam LB4. For example, while the fourth laser beam LB4 is emitted, the emitter antenna 321 may emit the ultrashort pulses in a terahertz wave band, and while the fourth laser beam LB4 is not emitted, the emitter antenna 321 might not emit the ultrashort pulses in a terahertz wave band.

The detector antenna 325 may include fifth and sixth electrodes 326 and 327, and a third photoconductive switch 328 connected to the fifth and sixth electrodes 326 and 327. The third photoconductive switch 328 may generate a light-excited carrier in response to a third laser beam LB3. Similar to descriptions of the first laser beam LB1 given with reference to FIGS. 2 and 3, the third laser beam LB3 may be a gating signal for turning on/off the detector antenna 325.

The inspection apparatus 10 may include a second optical bracket 350 coupled to the second printed circuit board 310, The second optical bracket 350 may be coupled to the second printed circuit board 310 by using, for example, a combination device 351, such as a bolt and a nut, The second optical bracket 350 may cover and fix optical components, which are integrated in the second probe 300, such as the third optical cable 361, the fourth lens 363, a third mirror 365, the fourth optical cable 371, the fifth lens 373, the fourth mirror 375, the fifth optical cable 381, the sixth lens 383, the second non-linear optical device 385, the seventh lens 387, and the fifth mirror 389.

The third optical cable 361, the fourth lens 363, the third mirror 265, the fourth optical. cable 371, the fifth lens 373, the fourth mirror 375, the fifth optical cable 381, the sixth lens 383, the second non-linear optical device 385, the seventh lens 387, and the fifth minor 389 may be fixed to the second optical bracket 350 by using, for example, epoxy, etc.

According to an example embodiment of the present inventive concept, the third optical cable 361, the fourth lens 363, the fourth optical cable 371, the fifth lens 373, the fifth optical cable 381, the sixth lens 383, the second non-linear optical device 385, and the seventh lens 387 may be arranged between the second printed circuit board 310 and the second optical bracket 350.

As a non-limiting example, the second optical bracket 350 may cover both surfaces (e.g., opposing sides) of the second printed circuit board 310. For example, the third and fourth optical connectors 360 and 370 may be arranged on a first surface of the second printed circuit board 310, and the fifth optical connector 380 may be arranged on a second surface opposite to the first surface of the second printed circuit board 310, but the present inventive concept is not limited thereto. For example, the second optical bracket 350 may cover only the first surface of the second printed circuit board 310, and the third through fifth optical connectors 360 through 380 may be arranged on the first surface thereof.

The third optical connector 360 may be coupled to the second optical bracket 350. The third optical connector 360 may be connected to the third optical cable 361. The third optical connector 360 may transmit the third laser beam LB3 into the second probe 300. The third laser beam LB3 introduced by the third optical connector 360 may be guided along the third optical cable 361. The third optical cable 361 may include optical fiber.

According to an example embodiment of the present inventive concept, wavelengths of the third laser beam LB3 and the fourth laser beam LB4 to be described below may be in a range of about 300 nm to about 1600 nm. As a non-limiting example, the wavelengths of each of the third and fourth laser beams LB3 and LB4 may be about 1560 nm.

The third optical cable 361 may be connected to a fourth lens 363. Accordingly, the third laser beam LB3 guided along the third optical cable 361 may be transferred to the fourth lens 363, The fourth lens 363 may focus the third laser beam LB3 to the third mirror 365. The third laser beam LB3 focused by the fourth lens 363 on the third mirror 365 may be reflected by the third mirror 365 The third laser beam LB3 reflected by the third minor 365 may be focused on the third photoconductive switch 328.

The fourth optical connector 370 may be connected to the fourth optical cable 371. The fourth optical connector 370 may transmit the fourth laser beam LB4 into the second probe 300. The fourth laser beam LB4 transmitted by the fourth optical connector 370 may be guided along the fourth optical cable 371. The fourth optical cable 371 may include optical fiber.

The fourth optical cable 371 may be connected to the fifth lens 373. Accordingly, the fourth laser beam LB4 guided along the fourth optical cable 371 may be transferred to the fifth lens 373. The fifth lens 373 may focus the fourth laser beam LB4 to the fourth mirror 375. The fourth laser beam LB4 focused by the fifth lens 373 to the fourth mirror 375 may be reflected by the fourth mirror 375, The fourth laser beam LB4 reflected by the fourth mirror 375 may be focused on the second photoconductive switch 324.

According to an example embodiment of the present inventive concept, after the third and fourth laser beams LB3 and LB4 are reflected by the third and fourth mirrors 365 and 375, respectively, the third and fourth laser beams LB3 and LB4 may be transferred to the third and second photoconductive switches 328 and 324, respectively, via a free space optics rather than fiber optics and optical integrated circuits. For example, air gaps may be respectively arranged between the third mirror 365 and the third photoconductive switch 328 of the detector antenna 325, and between the fourth mirror 375 and the second photoconductive switch 324 of the emitter antenna 321.

The fifth optical connector 380 may be connected to the fifth optical cable 381. The fifth optical connector 380 may introduce a fifth laser beam LB5 into the second probe 300. The fifth laser beam LB5 transmitted by the fifth optical connector 380 may be guided along the fifth optical cable 381. The fifth optical cable 381 may include optical fiber.

According to an example embodiment of the present inventive concept, a wavelength of the fifth laser beam LB5 may be in a range of about 300 nm to about 1600 nm. As a non-limiting example, the wavelength of the fifth laser beam LB5 may be about 1560 nm, The third through fifth laser beams LB3 through LB5 may be generated by the same laser device generating the first laser beam LB1, but the present inventive concept is not limited thereto.

The fifth optical cable 381 may be connected to the sixth lens 383. Accordingly, the fifth laser beam LB5 guided along a fifth optical cable 381 may be transferred to the sixth lens 383. The sixth lens 383 may focus the fifth laser beam LB5 on the second non-linear optical device 385. According to an example embodiment of the present inventive concept, because the sixth lens 383 focuses the fifth laser beam LB5 on the second non-linear optical device 385, a frequency conversion efficiency of the second non-linear optical device 385 may be increased (e.g., maximized), The second non-linear optical device 385 is substantially the same as the first non-linear optical device 275 described with reference to FIGS. 2 and 3, and thus, duplicate descriptions thereof may be omitted. The second non-linear optical device 385 may output a fifth laser beam LB5' having a wavelength of about 780 nm in response to the fifth laser beam LB5.

The fifth laser beam LB5' output by the second non-linear optical device 285 may reach the seventh lens 387. The seventh lens 387 may focus the fifth laser beam LB5' to the fifth mirror 389. The fifth laser beam LB5' focused by the seventh lens 387 to the fifth mirror 389 may he reflected by the fifth mirror 389, The fifth laser beam LB5' reflected by the fifth mirror 389 may be focused on the wafer W. The fifth laser beam LB5' may excite a portion of the wafer W, and in this case, carrier movement of the excited portion of the wafer W and sensitivity of doping concentration inspection may be increased.

Referring to FIGS. 1 through 4, the first excitation optics for exciting the first photoconductive switch 224 and the second excitation optics for exciting the wafer W may be integrated in the first probe 200, and the third excitation optics and the fourth excitation optics for respectively exciting the second and third photoconductive switches 324 and 328 and the fifth excitation optics for exciting the wafer W ma be integrated in the second probe 300. In other words, light paths of the first and second excitation optics (for example, light paths of the first and second laser beams LB2 and LB3) may be inside the first probe 200, and light paths of the third to fifth excitation optics (for example, light paths of the third through fifth laser beams LB$ through LB5) may be inside the second probe 300.

According to an example embodiment of the present inventive concept, in configuring the inspection apparatus 10, which is a terahertz time domain spectrometer, spaces for excitation optics separately provided for respective probes of existing technology may be drastically reduced. Accordingly, despite of the limited space of the inspection apparatus 10, the inspection apparatus 10 may include a plurality of probes (for example, the first and second probes 200 and 300) for inspecting the wafer W simultaneously (or alternately). The first and second probes 200 and 300 may inspect the wafer W, simultaneously, alternately, or in an arbitrary sequence.)

Furthermore, because the first through fifth excitation optics described above are embedded in the first and second probes 200 and 300 and fixed, the time for aligning optical components of the first through fifth excitation optics may be reduced. In addition, noise generated during an operation of the inspection apparatus 10 due to deviation from the alignment set for the optical components of the first through fifth excitation optics may be removed. Accordingly, the inspection speed of the inspection apparatus 10 may be increased and the reliability of the inspection apparatus 10 may be increased.

The inspection apparatus 10 may include a controller for driving the inspection stage 110, an operation of the inspection signal source 120, driving the alignment device 130, and driving electronic devices and optical components included in the first and second probes 200 and 300. The inspection apparatus 10 may further include a processor for detecting and analyzing signals generated by the first and second probes 200 and 300. The controller and the processor may be implemented as hardware, firmware, software, or a combination thereof. For example, the controller and the processor may include a computing device, such as a workstation computer, a desktop computer, a laptop computer, and a tablet computer. The controller and the processor may also include a simple controller, a microprocessor, a complex processor, such as a central processing unit (CPU), and a graphics processing unit (GPU), a processor including software, dedicated hardware, or firmware, The controller and the processor may be implemented as, for example, application specific hardware, such as a digital signal processor (DSP), a field programmable gate array (FPGA), and an application specific integrated circuit (ASIC), According to an example embodiments of the present inventive concept, the operations of the controller and the processor may be implemented by instructions stored in a machine-readable medium that may be read and executed by one or more processors. In this ease, the machine-readable medium may include an arbitrary mechanism for storing and/or transferring information in a form readable by a machine (for example, a computing device). For example, the machine-readable medium may include read-only memory (ROM), random access memory (RAM), a magnetic disk storage medium, an optical storage medium, a flash memory device, electrical, optical, acoustical, or other different forms of radio signals (for example, carrier wave, infrared signals digital signals or the like), and other arbitrary signals.

Firmware, software, routines, and instructions may be configured to perform the operations described for the controller and the processor, or any process to be described below. However, this is only for convenience of description, and it should be understood that the operations of the controller and the processor described above may also be executed by a computing device, a processor, or other devices executing firmware, software, routines, instructions, etc.

Those of ordinary skill in the art may, based on descriptions of the present inventive concept, realize an inspection apparatus including a plurality of first probes 200, an inspection apparatus including a plurality of second probes 300, and an inspection apparatus including the plurality of first probes 200 and the plurality of second probes 300 according to example embodiments of the present inventive concept.

Figure 5:
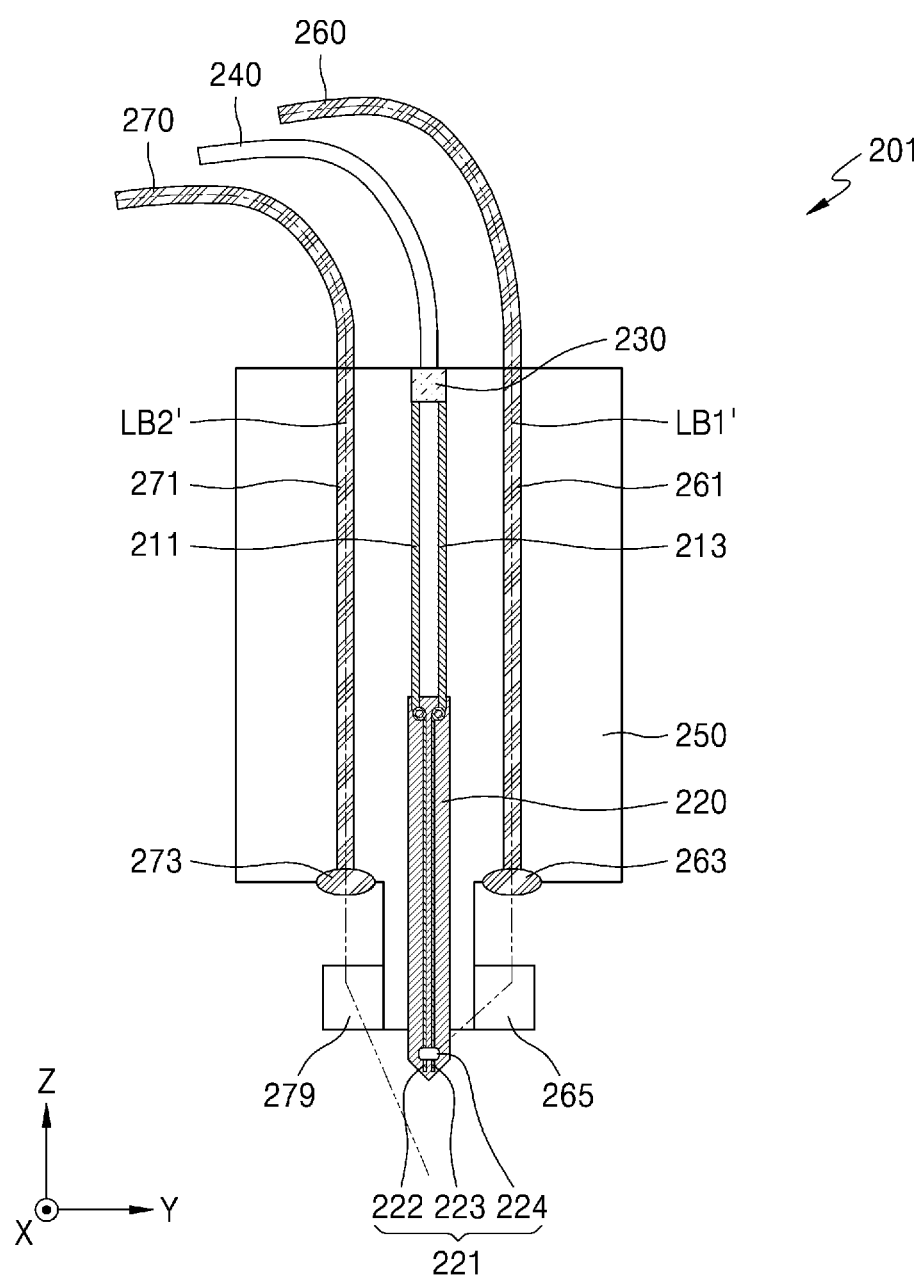
FIG. 5 is a diagram of a first probe according to an example embodiment of the present inventive concept.

FIG. 5 is a diagram of a first probe 201 according to an example embodiment of the present inventive concept.

The first probe 201 of FIG. 5 may include a probe of a transmission type, which is similar to the first probe 200 described with reference to FIGS. 2 and 3. The first probe 201 may be adopted as an alternative for the first probe 200 in FIGS. 1 through 3.

Referring to FIG. 5, similar to the first probe 200 in FIGS. 1 through 3, the first probe 201 may include a first terahertz wave optics including the first printed circuit board 210, the first probe tip 220, an RF connector 230, and the RF signal line 240, and a first excitation optics including the first optical connector 260, the first optical cable 261, the first lens 263, and the first minor 265. Configurations of the first terahertz wave optics and the first excitation optics are substantially the same as descriptions given with reference to FIGS. 1 through 3, and thus, duplicate descriptions thereof may be omitted.

According to an example embodiments of the present inventive concept, the first probe 201 may include the second optical connector 270, the second optical cable 271, the second lens 273, and a second mirror 279. The second optical connector 270 may transmit the second laser beam LB2' into the first probe 201. The second laser beam LB2' transmitted by the second optical connector 270 may be guided along the second optical cable 271. The second laser beam LB2' transmitted by the second optical cable 271 may be focused by the second lens 273, which is connected to the second optical cable 271, to the second mirror 279, which reflects the second laser beam LB2'. The second laser beam LB3' reflected by the second mirror 279 may be focused on the wafer W.

In an example, the first and second laser beams LB1' and LB2' may have predetermined wavelengths for exciting the first photoconductive switch 224 and the wafer W, respectively. For example, each of the wavelengths of the first and second laser beams LB1' and LB2' may be in a range of about 200 nm to about 800 nm. According to an example embodiment of the present inventive concept, for example, each of the wavelengths of the first and second laser beams LB1' and LB1' may be about 780 nm.

In another example, the second laser beam (LB2 in FIG. 2) generated by the same oscillator as the first laser beam LB1', which has a wavelength in a range of about 200 nm to about 1600 nm, may be transferred to a non-linear optical device outside of the first probe 201. The second laser beam LB2' generated by the non-linear optical device may be transmitted via the second optical connector 270 into the first probe 201.

Figure 6:
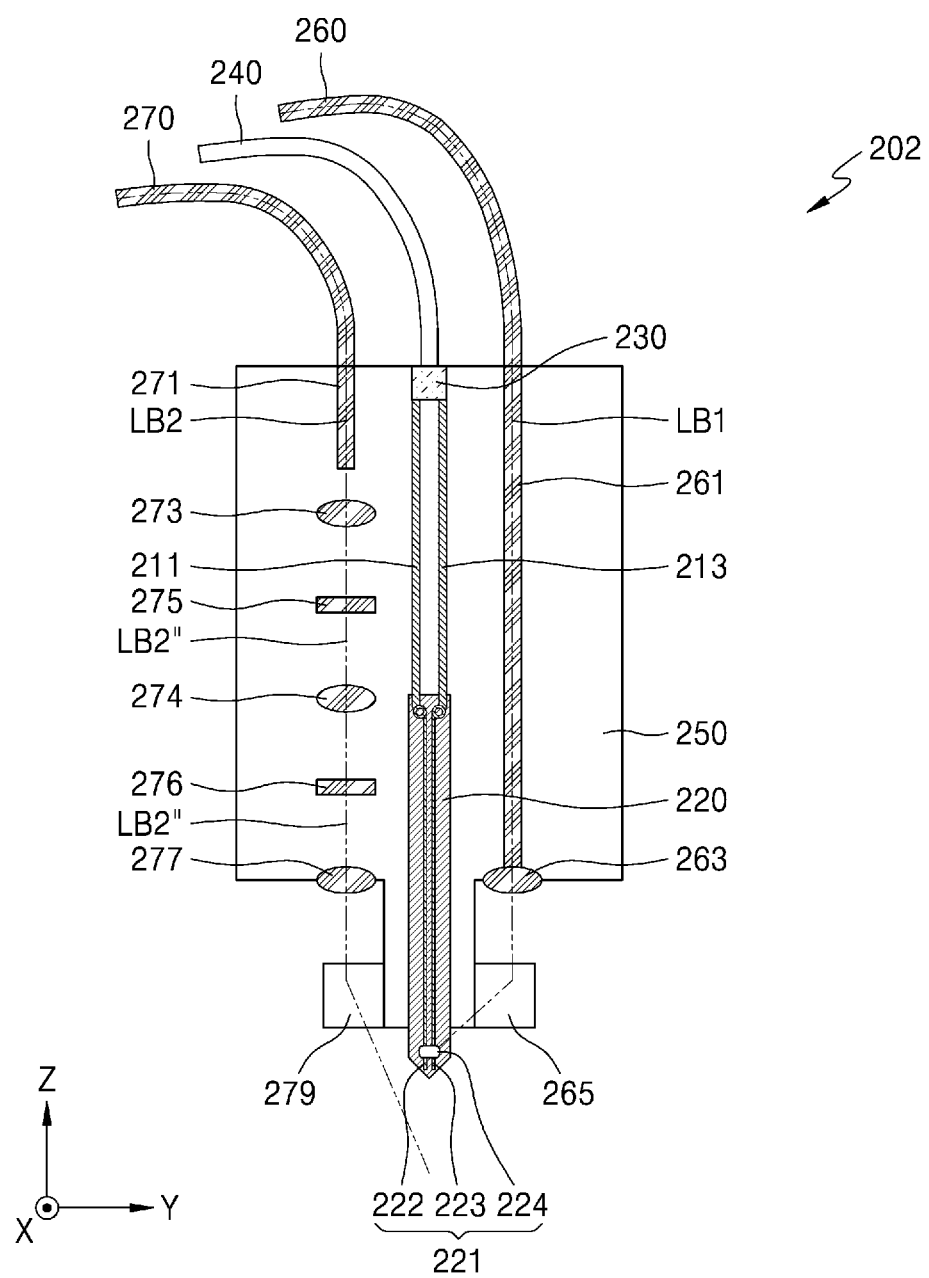
FIG. 6 is a diagram of a first probe according. to an example embodiment of the present inventive concept.

FIG. 6 is a diagram of a first probe 202 according to an example embodiment of the present inventive concept.

The first probe 202 of FIG. 6 may include a probe of a transmission type, which is similar to the first probe 200 described with reference to FIGS. 2 and 3. The first probe 202 may be adopted as an alternative for the first probe 200 in FIGS. 1 through 3.

Referring to FIG. 6, similar to the first probe 200 in FIGS. 1 through 3, the first probe 201 may include a first terahertz wave optics including the first printed circuit board 210, the first probe tip 220, an RF connector 230, and the RF signal line 240, and a first excitation optics including the first optical connector 260, the first optical cable 261, the first lens 263, and the first mirror 265. Configurations of the first terahertz wave optics and the first excitation optics are substantially the same as descriptions given with reference to FIGS. 1 through 3, and thus, duplicate descriptions thereof may be omitted.

According to an example embodiment of the present inventive concept, a second excitation optics of the first probe 202 may additionally include a lens 274 and a non-linear optical device 276, in addition to the second optical connector 270, the second optical cable 271, the second lens 273, the first non-linear optical device 275, the third lens 277, and the second mirror 279.

According to an example embodiment of the present inventive concept, the lens 274 may be arranged on a light path of the second laser beam LB2" between the first non-linear optical device 275 and the third lens 277. The non-linear optical device 276 may be arranged on a light path of the second laser beam LB2' between the lens 274 and the third lens 277. According to an example embodiment of the present inventive concept, the lens 274 may focus the second laser beam LB2' on the non-linear optical device 276, The non-linear optical device 276 may output a second laser beam LB2" in response to the second laser beam LB2' from the lens 274. According to an example embodiment of the present inventive concept, the second laser beam LB2" may be generated based on the second-order non-linear optical phenomenon including SHG, the third-order non-linear optical phenomenon, and the fourth-order non-linear optical phenomenon, described with reference to FIGS. 1 through 3. According to an example embodiment of the present inventive concept, the second laser beam LB2" may have a shorter wavelength than that of the second laser beam LB2'. As a non-limiting example, the non-linear optical device 276 may perform SHG, and when a wavelength of the second laser beam LB2' is about 780 nm, a wavelength of the second laser beam LB2 may be about 390 nm.

Figure 7:
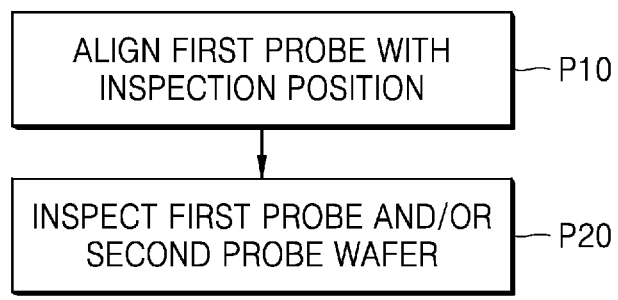
FIG. 7 is a flowchart of an inspection method according to an example embodiment of the present inventive concept.

FIG. 7 is a flowchart of an inspection method according to an example embodiment of the present inventive concept Referring to FIGS. 1 and 7, the first probe 200 may be aligned with an inspection position (P10). The terahertz wave TW may spatially have a Gaussian distribution. According, to an example embodiment of the present inventive concept, by scanning the position of the first probe 200 in the X direction and the Y direction so that an intensity of the terahertz wave TW sensed by the receiver antenna (221 of FIG. 2) of the first probe 200 may be increased, the first probe 200 may be aligned. When only the reflection mode inspection using the second probe 300 is performed, the alignment of P10 may also be omitted.

Next, the wafer W may be inspected by using the first probe 200 and/or the second probe 300 (P20). For example, the wafer W may be inspected by using the first probe 200 in a transmission mode, the wafer W may be inspected by using the second probe 300 in a reflection mode, or different points on the wafer W may be simultaneously inspected by using the first and second probes 200 and 300.

According to an example embodiment of the present inventive concept, the inspection apparatus 10 may inspect the wafer W by simultaneously using the first and second probes 200 and 300, Accordingly, in the inspection of the wafer W, the time for moving the wafer W may be reduced.

Figure 8:
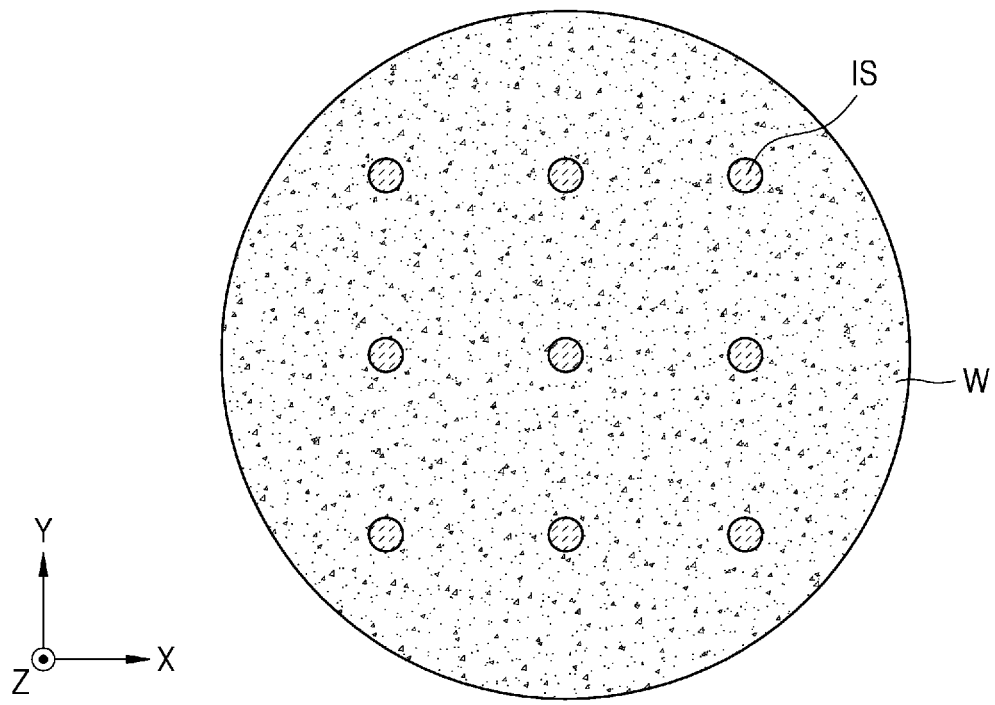
Figure 9:
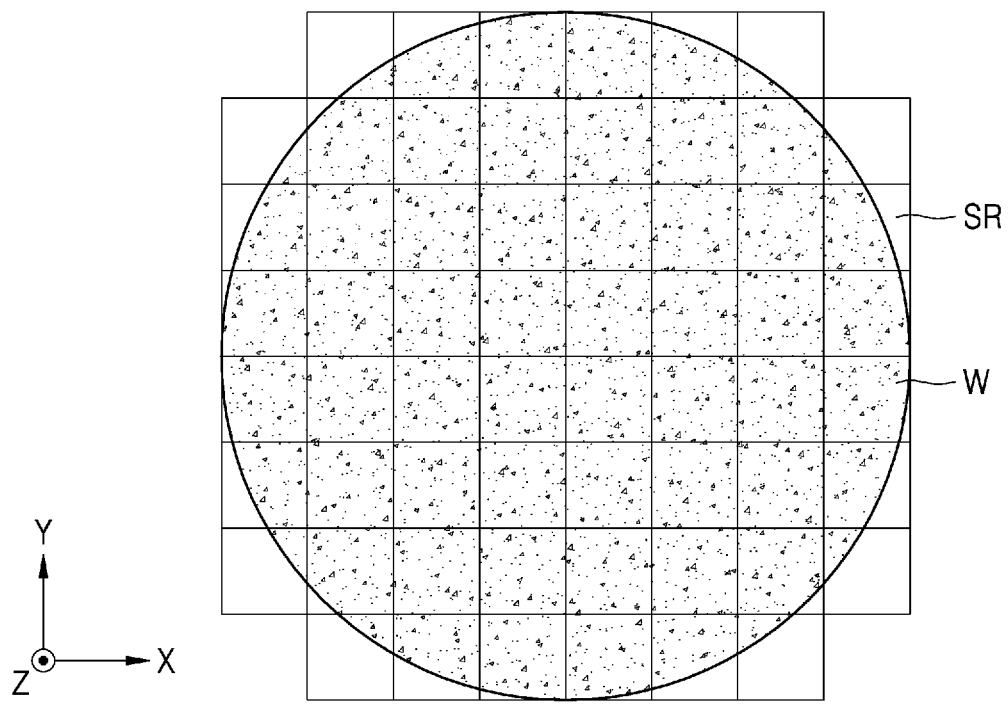

FIGS. 8 and 9 are schematic diagrams describing inspection of an inspection apparatus according to an example embodiment of the present inventive concept.

Referring to FIG. 8, a plurality of different inspection spots IS on the wafer W are illustrated. As a non-limiting example, there may be nine inspection spots IS on the wafer W. An inspection apparatus may include, for example, nine first probes (200 of FIG. 1), or nine second probes (300 of FIG. 1). As another example, an inspection apparatus may include one or more of the first probes (200 of FIG. 1) and one or more of the second probes (300 of FIG. 1), and a sum of the numbers of first and second probes (200 and 300 of FIG.) may be nine.

According to an example embodiment of the present inventive concept, the wafer W may be inspected by using an inspection apparatus, which includes the same number of first and second probes (200 and 300 of FIG. 1) as the number of inspection spots IS. Accordingly, all the inspection spots IS may be simultaneously inspected and at the same time, the time for aligning the first and second probes (200 and 300 of FIG. 1) with the inspection spots IS may be reduced, and thus, the wafer W may be inspected at a speed of nine times faster than that of a conventional inspection apparatus.

Referring to FIG. 9, the wafer W may be divided into a plurality of different scanning regions SR from each other. As a non-limiting example, the wafer W haying a diameter of about 300 ram may be divided into 60 scanning regions SR. In this case, each of an X direction length and a Y direction length of each scanning region SR may be about 37.5 mm.

According to an implementation example, an X direction length LX1 of the first probe 200 in FIG. 1 may be in a range of about 1 mm to about 10 mm, and an X direction length LX2 of the second probe 300 in FIG. 1 may be in a range of about 2 mm to about 20 mm. Y direction lengths LY of the first and second probes 200 and 300 may be substantially the same as each other. The Y direction lengths LY of the first and second probes 200 and 300 may be in a range of about 2 mm to about 25 mm. Accordingly, any one of the first probe (200 of FIG. 1) or the second probe (300 of FIG. 1) corresponding to an inspection region of a wafer divided into 60 pieces, may be arranged, and 60 scanning regions SR may be .substantially and simultaneously inspected. Accordingly, an inspection apparatus according to an example embodiment of the present inventive concept may scan a front side of the wafer W at a speed of 60 times or more.

FIG. 10 is a flowchart describing a manufacturing method of the first probe (200 of FIG. 1) of the inspection apparatus (100 of FIG. 1), according to an example embodiment of the present inventive concept, FIG. 10 illustrates a method of providing the first excitation optics of the first probe (200 of FIG. 1)

FIGS. 11A through 11C are side cross-sectional views for describing the method of manufacturing a first probe illustrated in FIG. 10.

Referring to FIGS. 10 and 11A, the first optical cable 261 and the first lens 263 may be provided to the first optical bracket 250 (P110). The first optical cable 261 and the first lens 263 may be arranged at pre-set positions on the first optical bracket 250. The first optical cable 261 and the first lens 263 may be fixed by the first optical bracket 250.

Referring to FIGS. 10 and 11B, the first printed circuit board 210 including the first probe tip 220 may be coupled to the first optical bracket 250) (P120). The first printed circuit board 210 and the first optical bracket 250 may be fixed to each other by using a fixing device, such as a bolt and a nut, but the present inventive concept is not limited thereto.

Referring to FIGS. 3, 10, and 11C, the first mirror 265 may be provided to the first optical bracket 250 (P130). According to an example embodiment of the present inventive concept, the first mirror 265 may be aligned with respect to the first optical bracket 250 by using a first feedback circuit FC1 and a manipulator Ma. The first mirror 265 may be aligned by using a first active alignment method. The first active alignment method may generate a feedback signal based on current output by the receiver antenna 221. The first feedback circuit FC1 may sense a magnitude of an optical current generated by the receiver antenna 221 of the first probe tip 220, and the manipulator Ma may adjust a position and a direction of the first mirror 265 so that the magnitude of the optical current is increased. (e.g., maximized), based on the feedback signal of the first feedback circuit FC 1. Accordingly, the first mirror 265 may be aligned so that the focus of the first laser beam LB I is positioned on the first photoconductive switch 224 of the receiver antenna 221. The first mirror 265 aligned by using the method described above may be fixed to the first optical bracket 250 by using, for example, epoxy, etc.

FIG. 12 is a flowchart describing a manufacturing method of the first probe (200 of FIG. 1) of the inspection apparatus (100 of FIG. 1), according to an example embodiment of the present inventive concept. FIG. 12 illustrates a method of providing the second excitation optics of the first probe (200 of FIG.).

FIGS. 13A through 13D are side cross-sectional views for describing the method o - manufacturing a first probe illustrated in FIG. 10.

Figure 13A:
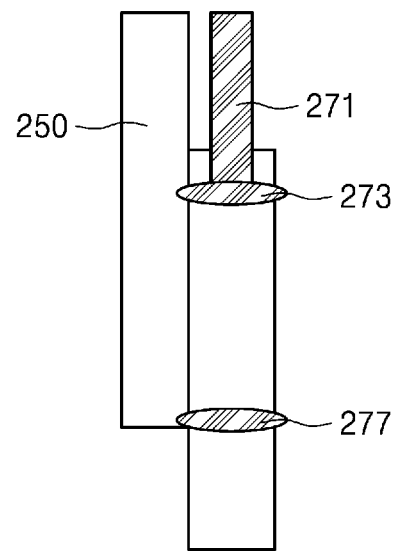

Referring to FIGS. 12 and 13A, the second optical cable 271, the second lens 273, and the third lens 277 may be provided to the first optical bracket 250 (P210). The second optical cable 271, the second lens 273, and the third lens 277 may be arranged at pre-set positions on the first optical bracket 250. The second optical cable 271 and the second lens 273 may be fixed to the first optical bracket 250 by using, for example, epoxy, etc. For example, the third lens 277 may be loosely fixed to the first optical bracket 250; however, the present inventive concept is not limited thereto.

Figure 13B:
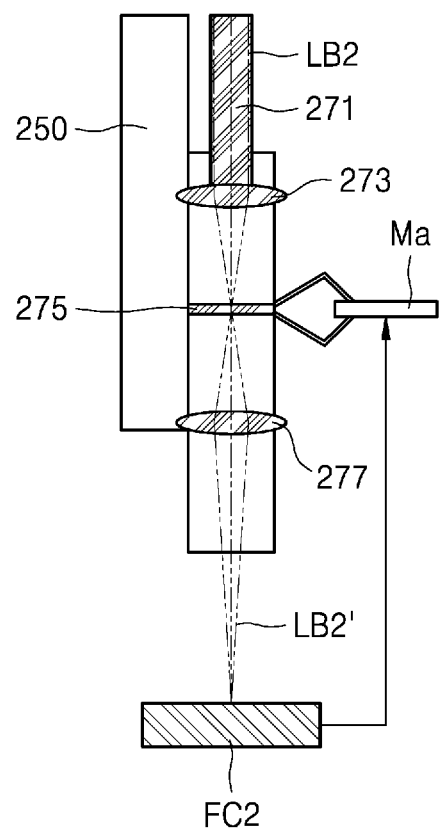

Next, referring to FIGS. 12 and 13B, the first non-linear optical device 275 may be provided to the first optical bracket 250 (P220). According to an example embodiment of the present inventive concept, the alignment of the first non-linear optical device 275 may be performed by a second feedback circuit FC2 and the manipulator Ma. The first non-linear optical device 275 may be aligned by using a second active alignment method. The second active alignment method mays generate a feedback signal in response to the intensity of the second laser beam LB2', which is generated by the first non-linear optical device 275 in response to the second laser beam LB2. The second feedback circuit FC2 may measure the intensity of the second laser beam LB2', and the manipulator Ma may adjust a position of the first non-linear optical device 275 so that the intensity of the second laser beam LB2' is increased (e.g., maximized) in response to a feedback signal of the second feedback circuit FC2. Accordingly, the first non-linear optical device 275 may be aligned to be positioned at a focus of the second lens 273 with respect to the second laser beam LB2.

Figure 13C:
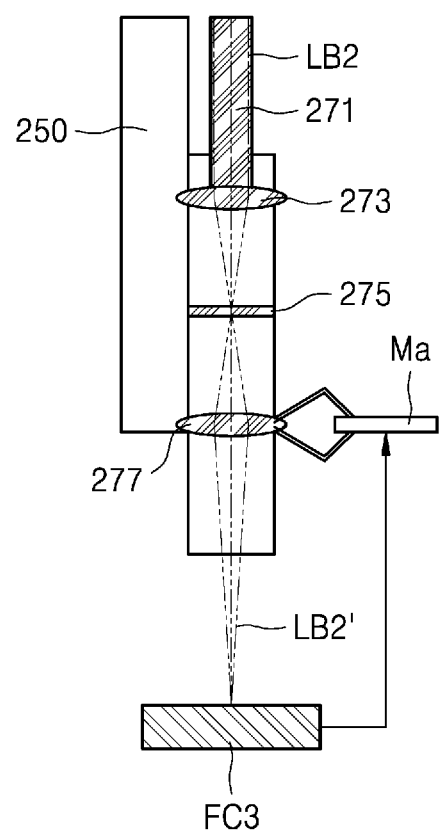

Next, referring to FIGS. 12 and 13C, the third lens 277 may be aligned and fixed to the first optical bracket 250 (P230). According to an example embodiment of the present inventive concept, the alignment of the third lens 277 may be performed by a third feedback circuit. FC3 and the manipulator Ma. The third lens 277 may be aligned by using a third active alignment method. The third active alignment method may generate a feedback signal based on the second laser beam The third feedback circuit FC3 may include a beam profiler configured to measure a space-intensity distribution of the second laser beam LB2'. According, to au example embodiment of the present inventive concept, the third feedback circuit FC3 may measure a beam profile of the second laser beam L82', and the manipulator Ma may adjust a position of the third lens 277 so that a focus of the second laser beam LB2' is arranged at a pre-set position based on a feedback signal of the third feedback circuit FC3 based on the measured beam profile of the second laser beam Next, the third lens 277, which is aligned by using the method described above, may be fixed to the first optical bracket 250 by using, for example, epoxy, etc.

Figure 13D:
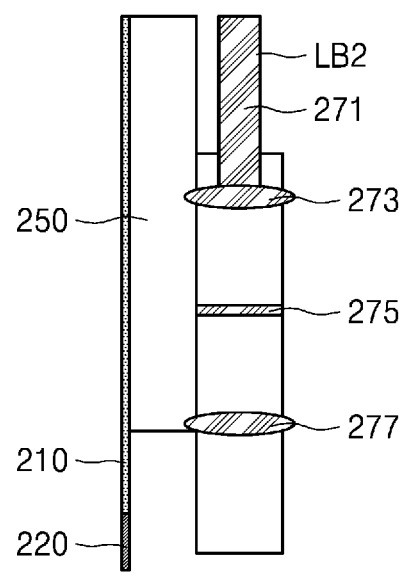

Next, referring to FIGS. 12 and 13D, a printed circuit board on which a probe tip is mounted and an optical bracket may be coupled to each other (P240). P240 is substantially the same as P120 in FIG. 10, and thus, duplicate descriptions thereof may be omitted.

Figure 13E:
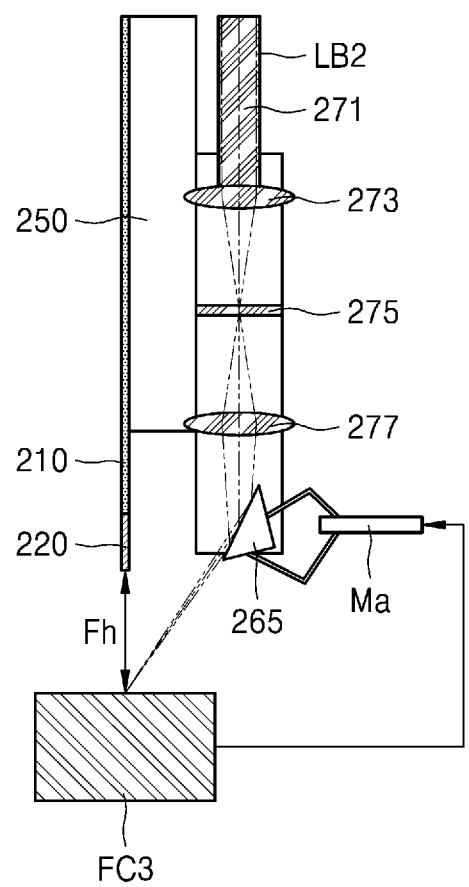

Next, referring to FIGS. 12 and 13E, the second mirror 279 may be provided to the first optical bracket 250 (P250). According to an example embodiment of the present inventive concept, the second mirror 279 may be aligned with respect to the first optical bracket 250 by the first feedback circuit FC 1 and the manipulator Ma. The second mirror 279 may be aligned by using the third active alignment method described above-According to an example embodiment of the present inventive concept, the third feedback circuit FC3 may measure the beam profile of the second laser beam LB2', and the manipulator Ma may align the second mirror 279 so that the focus of the second laser beam LB2' overlaps a probe in a vertical direction (for example, the Z direction in FIG. 1) and is spaced apart from the first probe tip 220 by a pre-set focus height Fh.-. The second minor 279 aligned by using the method described above may be fixed to the first optical bracket 250 by using, for example, epoxy, etc.

FIG. 14 is a flowchart describing a manufacturing method of the first probe (200 of FIG. 1) of the inspection apparatus (100 of FIG. 1) according to an example embodiment of the present inventive concept. FIG, 10 illustrates a method of providing the first excitation optics of the first probe (200 of FIG. 1), FIG. 15 is a side cross-sectional view for describing the method of manufacturing a first probe illustrated in FIG. 14, Referring to FIGS. 14 and 15, a first optical cable 261', the first lens 263, a non-linear optical device 267, and a lens 269 may be provided to the first optical bracket 250, and the first printed circuit board 210 on which the first probe tip 220 is mounted and the first optical bracket 250 may be coupled to each other. P310 is substantially the same as operations described with reference to FIGS. 12 through 13D, and thus, duplicate descriptions thereof may be omitted.

Next, the first mirror 265 may be provided to the first optical bracket 250 (P320). Providing the first mirror 265 is substantially the same as P130 described with reference to FIGS. 10 and 11C, and thus, duplicate descriptions thereof may be omitted.

Those of ordinary skill in the art should be understand manufacturing of the second probe 300 of FIG. 4, the first probe 201 of FIG. 5, and the first probe 202 of FIG. 6, in addition to manufacturing of the first probe 200 of FIG. 2, based on descriptions given with reference to FIGS. 10 through 15, While the present inventive concept has been described with reference to embodiments thereof, it will be understood by those of ordinary skill in the art that various changes in form and details may be made thereto without departing from the spirit and scope of the present inventive concept

What is claimed is:

1. An inspection apparatus comprising:
a stage configured to support a wafer;
an inspection signal source facing the stage, and configured to emit a terahertz wave to the wafer;
a first probe including a receiver antenna configured to detect the terahertz wave emitted by the inspection signal source and that has passed through the wafer; and
a second probe including an emitter antenna and a detector antenna, wherein the emitter antenna is configured to emit a terahertz wave to the wafer, and the detector antenna is configured to detect the terahertz wave emitted by the emitter antenna and reflected by the wafer, wherein the first probe includes:
a first probe tip in which the receiver antenna is embedded, the receiver antenna including a first photoconductive switch;
a first printed circuit board on which the first probe tip is mounted;
a first optical bracket coupled to the first printed circuit board;
a first optical connector configured to transmit a first laser beam into the first probe, and coupled to the first optical bracket, wherein the first laser beam is configured to excite the first photoconductive switch;
a first optical cable connected to the first optical connector, arranged between the first optical bracket and the first printed circuit board, and configured to guide the first laser beam;
a first lens connected to the first optical cable, fixed to the first optical bracket, and configured to focus the first laser beam; and
a first mirror fixed to the first optical bracket and configured to reflect the first laser beam received from the first lens so that the first laser beam is directed toward the first photoconductive switch.

2. The inspection apparatus of claim 1, wherein an air gap is arranged between the first mirror and the first photoconductive switch.

3. The inspection apparatus of claim 1, wherein the first probe further includes:
a second optical connector configured to transmit a second laser beam into the first probe, and coupled to the first optical bracket, wherein the second laser beam is configured to excite the wafer;
a second optical cable connected to the second optical connector, arranged between the first optical bracket and the first printed circuit board, and configured to guide the second laser beam; and
a second mirror configured to reflect the second laser beam so that the second laser beam is directed toward the wafer.

4. The inspection apparatus of claim 3, wherein the first probe further includes: a second lens arranged on a path of the second laser beam between the second optical cable and the second mirror;
a first non-linear optical device arranged on a path of the second laser beam between the second lens and the second mirror; and
a third lens arranged on the path of the second laser beam between the first non-linear optical device and the second mirror.

5. The inspection apparatus of claim 4, wherein the first non-linear optical device includes a second-order harmonic generator.

6. The inspection apparatus of claim 4, wherein the first non-linear optical device includes one of periodically poled lithium niobate (PPLN) crystal and beta barium borate (BBO) or β-BaB$_2$O$_4$ crystal.

7. The inspection apparatus of claim 4, wherein the first non-linear optical device is arranged to receive the second laser beam focused by the second lens.

8. The inspection apparatus of claim 1, wherein the second probe includes:
a second probe tip in which the emitter antenna and the detector antenna are embedded, the emitter antenna including a second photoconductive switch, and the detector antenna including a third photoconductive switch;
a second primed circuit board on which the second probe tip is mounted;
a second optical bracket coupled to the second printed circuit board;
a third optical connector configured to transmit a third laser beam into the second probe, and coupled to the second optical bracket, wherein the third laser beam is configured to excite the second photoconductive switch;
a third optical cable connected to the third optical connector, arranged between the second optical bracket and the second printed circuit board, and configured to guide the third laser beam;
a fourth lens connected to the third optical cable, fixed to the second optical bracket, and configured to focus the third laser beam; and
a third mirror fixed to the first optical bracket and configured to reflect the third laser beam received from the fourth lens so that the third laser beam is directed toward the second photoconductive switch.

9. The inspection apparatus of claim 8, wherein the second probe includes:
a fourth optical connector configured to transmit a fourth laser beam into the second probe, and coupled to the second optical bracket, wherein the fourth laser beam is configured to excite the third photoconductive switch;
a fourth optical cable connected to the fourth optical connector, arranged between the second optical bracket and the second printed circuit board, and configured to guide the fourth laser beam;
a fifth lens connected to the fourth optical cable, fixed to the second optical bracket, and configured to focus the fourth laser beam; and
a fourth mirror fixed to the second optical bracket and configured to reflect the fourth laser beam received from the fifth lens so that the fourth laser beam is directed toward the third photoconductive switch.

10. The inspection apparatus of claim 9, wherein air gaps are respectively arranged between the third mirror and the second photoconductive switch, and between the fourth mirror and the third photoconductive switch.

11. The inspection apparatus of claim 9, wherein the second probe further includes:
a fifth optical connector configured to transmit a fifth laser beam into the second probe, and coupled to the second optical bracket, wherein the fifth laser beam is configured to excite the water;
a fifth optical cable connected to the fifth optical connector, arranged between the second optical bracket and the second printed circuit board, and configured to guide the fifth laser beam; and
a fifth mirror configured to reflect the fifth laser beam so that the fifth laser beam is directed toward the water.

12. The inspection apparatus of claim 11, further comprising:
a sixth lens arranged on a path of the fifth laser beam between the fifth optical cable and the fifth mirror;
a second non-linear optical device arranged on a path of the fifth laser beam between the sixth lens and the fifth mirror; and
a seventh lens arranged on the path of the fifth laser beam between the second non-linear optical device and the fifth minor.

13. An inspection apparatus comprising:
a stage including an upper surface parallel to a first direction and a second direction intersecting the first direction, and supporting a wafer;

an inspection signal source configured to emit a terahertz wave on the wafer;

a first probe including a receiver antenna configured to detect the terahertz wave emitted by the inspection signal source and that has passed through the Wafer, and a second probe including an emitter antenna and a detector antenna, wherein the emitter antenna is configured to emit a terahertz wave to the wafer, and the detector antenna is configured to detect the terahertz wave emitted by the emitter antenna and reflected by the wafer, wherein the first probe includes:

a first printed circuit board;

a first probe tip, in which the receiver antenna is embedded, mounted on the first printed circuit board, wherein the receiver antenna includes, a first photoconductive switch;

a first optical bracket coupled to the first printed circuit board;

a first optical connector configured to transmit a first laser beam into the first probe, and coupled to the first optical bracket, wherein the first laser beam is configured to excite the first photoconductive switch; and a second optical connector configured to transmit a second laser beam into the first probe, and coupled to the first optical bracket, wherein the second laser beam is configured to excite the wafer;

wherein the second probe includes:

a second printed circuit board;

a second probe tip, in which the emitter antenna and the detector antenna are embedded, mounted on the second printed circuit board, wherein the emitter antenna includes a second photoconductive switch, and wherein the detector antenna includes a third photoconductive switch;

a second optical bracket coupled to the second printed circuit board;

a third optical connector configured to transmit a third laser beam into the second probe, and coupled to the second optical bracket, wherein the third laser beam is configured to excite the second photoconductive switch;

a fourth optical connector configured to transmit a fourth laser beam into the second probe, and coupled to the second optical bracket, wherein the fourth laser beam is configured to excite the third photoconductive switch; and a fifth optical connector configured to transmit a fifth laser beam into the second probe, and coupled to the second optical bracket, wherein the fifth laser beam is configured to excite the wafer.

14. The inspection apparatus of claim 13, wherein the first and second probes are configured to simultaneously inspect the wafer.

15. The inspection apparatus of claim 13, further comprising an alignment device configured to arrange the first and second probes with respect to the wafer, wherein the first and second probes are mounted on the alignment device.

16. The inspection apparatus of claim 13, wherein a length of the first probe in the first direction is in a range of 1 mm to 10 mm.

17. The inspection apparatus of claim 13, wherein a length of the second probe in the first direction is in a range of 2 mm to 20 mm.

18. The inspection apparatus of claim 13, wherein lengths of the first and second probes in the second direction are substantially identical to each other.

19. The inspection apparatus of claim 13, wherein a lengths of the first and second probes in the second direction are in a range of 2 mm to 25 mm.

20. An inspection apparatus comprising:

a stage including an upper surface parallel to a first direction and a second direction intersecting the first direction, and supporting a wafer;

an inspection signal source configured to emit a terahertz wave on the wafer;

a first probe including a receiver antenna configured to detect the terahertz wave emitted by the inspection signal source and that has passed through the wafer; and a second probe including an emitter antenna and a detector antenna, wherein the emitter antenna is configured to emit a terahertz wave to the wafer, and the detector antenna is configured to detect the terahertz wave emitted by the emitter antenna and reflected by the wafer, wherein the second probe includes:

a second printed circuit board;

a second probe tip, in which the emitter antenna and the detector antenna are embedded, mounted on the second printed circuit board, wherein the emitter antenna includes a second photoconductive switch, and wherein the detector antenna includes a third photoconductive switch;

a second optical bracket coupled to the second printed circuit board;

a third optical connector configured to transmit a third laser beam into the second probe, and coupled to the second optical bracket, wherein the third laser beam is configured to excite the second photoconductive switch;

a fourth optical connector configured to transmit a fourth laser beam into the second probe, and coupled to the second optical bracket, wherein the fourth laser beam is configured to excite the third photoconductive switch; and a fifth optical connector configured to transmit a fifth laser beam into the second probe, and coupled to the second optical bracket, wherein the fifth laser beam is configured to excite the wafer.

* * * * *